US012575461B2

(12) United States Patent
Murakami et al.

(10) Patent No.: US 12,575,461 B2
(45) Date of Patent: Mar. 10, 2026

(54) SEMICONDUCTOR DEVICE

(71) Applicant: Mitsubishi Electric Corporation, Tokyo (JP)

(72) Inventors: Haruhiko Murakami, Tokyo (JP); Yuji Miyazaki, Tokyo (JP); Yasutaka Shimizu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 389 days.

(21) Appl. No.: 18/460,504

(22) Filed: Sep. 1, 2023

(65) Prior Publication Data

US 2024/0186287 A1     Jun. 6, 2024

(30)     Foreign Application Priority Data

Dec. 2, 2022     (JP) ................................. 2022-193414

(51) Int. Cl.
 *H01L 25/065*  (2023.01)
 *H01L 23/00*  (2006.01)
   (Continued)

(52) U.S. Cl.
 CPC .... *H01L 25/0655* (2013.01); *H01L 23/49811* (2013.01); *H01L 23/49844* (2013.01); *H01L 23/528* (2013.01); *H01L 24/48* (2013.01); *H01L 2224/48137* (2013.01); *H01L 2224/48227* (2013.01); *H01L 2924/12032* (2013.01); *H01L 2924/12036* (2013.01); *H01L 2924/13055* (2013.01); *H01L 2924/13091* (2013.01)

(58) Field of Classification Search
 CPC ........... H01L 25/0655; H01L 23/49811; H01L 23/49844; H01L 23/528; H01L 24/48; H01L 2224/48137; H01L 2224/48227; H01L 2924/12032; H01L 2924/12036; H01L 2924/13055; H01L 2924/13091; H01L 24/49; H01L 25/072; H01L 25/18; H01L 2224/4813; H01L 2224/48141
 See application file for complete search history.

(56)     References Cited

U.S. PATENT DOCUMENTS

2003/0213979 A1 11/2003 Nakajima et al.
2006/0290689 A1* 12/2006 Grant .................... H02M 7/003
            257/734

(Continued)

FOREIGN PATENT DOCUMENTS

JP  2003-264265 A  9/2003
JP  2014-225706 A  12/2014
JP  2017-208547 A  11/2017

*Primary Examiner* — Jonathan Han
(74) *Attorney, Agent, or Firm* — Studebaker Brackett PLLC

(57)     ABSTRACT

A semiconductor device includes: a second metal pattern electrically connected to a first semiconductor element and a second semiconductor element; a third metal pattern electrically connected to the second semiconductor element; a fifth metal pattern electrically connected to the third semiconductor element and a fourth semiconductor element; a sixth metal pattern electrically connected to the fourth semiconductor element; and a first conductive portion straddling the third metal pattern and the sixth metal pattern in plan view and electrically connecting the second metal pattern and the fifth metal pattern.

9 Claims, 6 Drawing Sheets

(51) Int. Cl.
    *H01L 23/498*      (2006.01)
    *H01L 23/528*      (2006.01)

(56)              References Cited

U.S. PATENT DOCUMENTS

| | | | |
|---|---|---|---|
| 2015/0023081 A1 | 1/2015 | Obiraki et al. | |
| 2017/0338162 A1 | 11/2017 | Cottet et al. | |
| 2024/0138069 A1* | 4/2024 | Jeon | ........................ H01L 24/49 |

* cited by examiner

F I G. 1
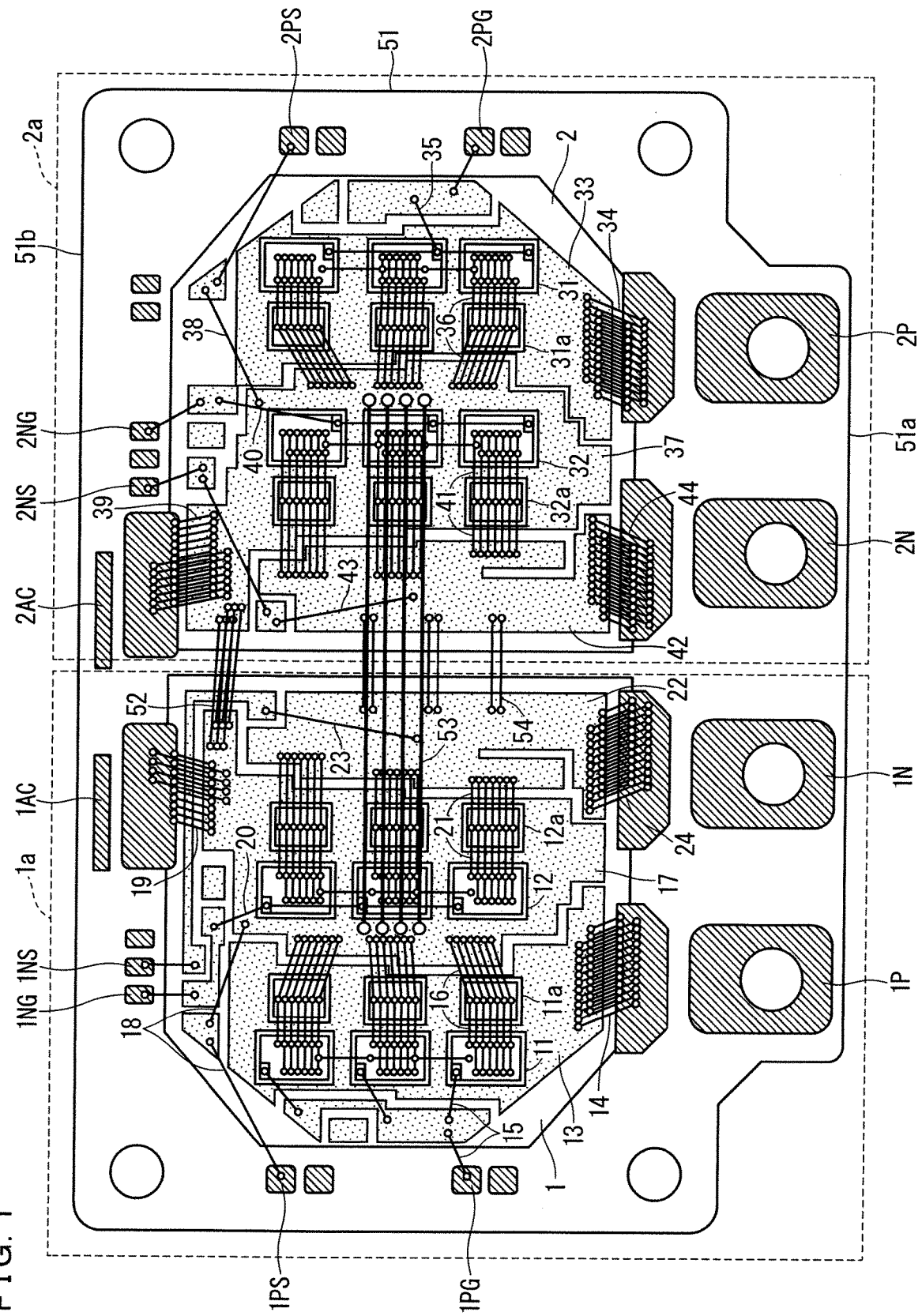

F I G. 2
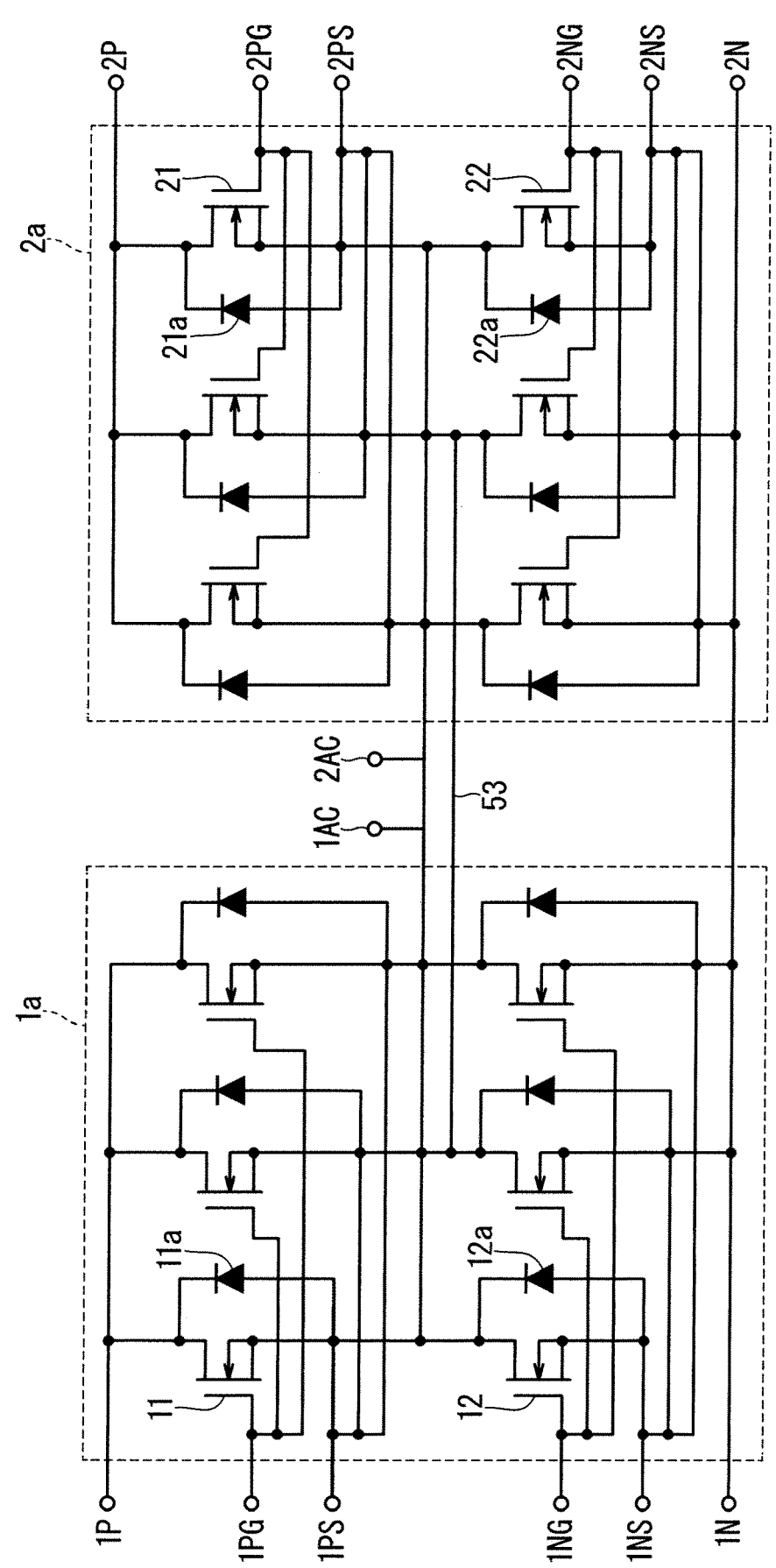

F I G. 3
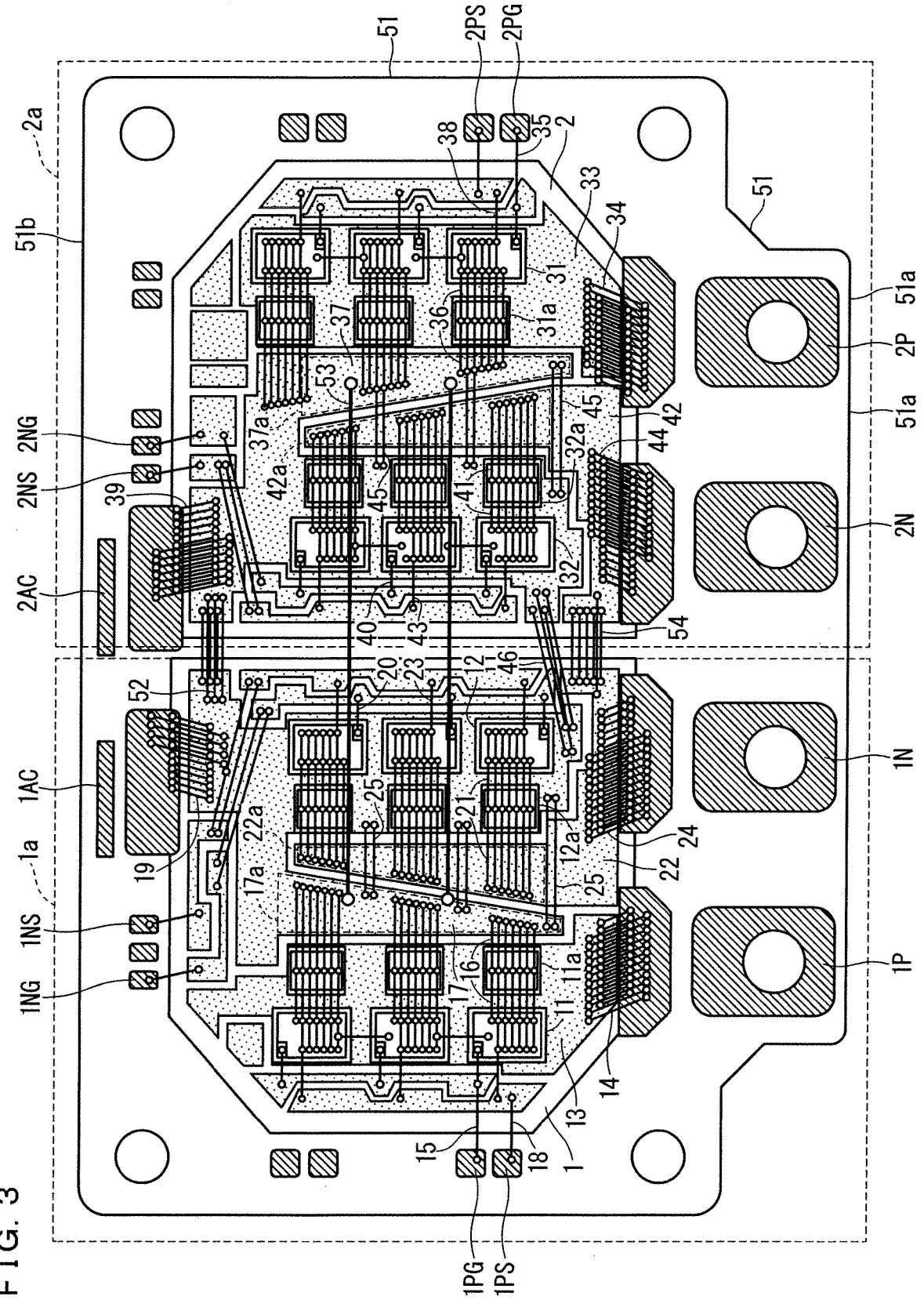

F I G. 4
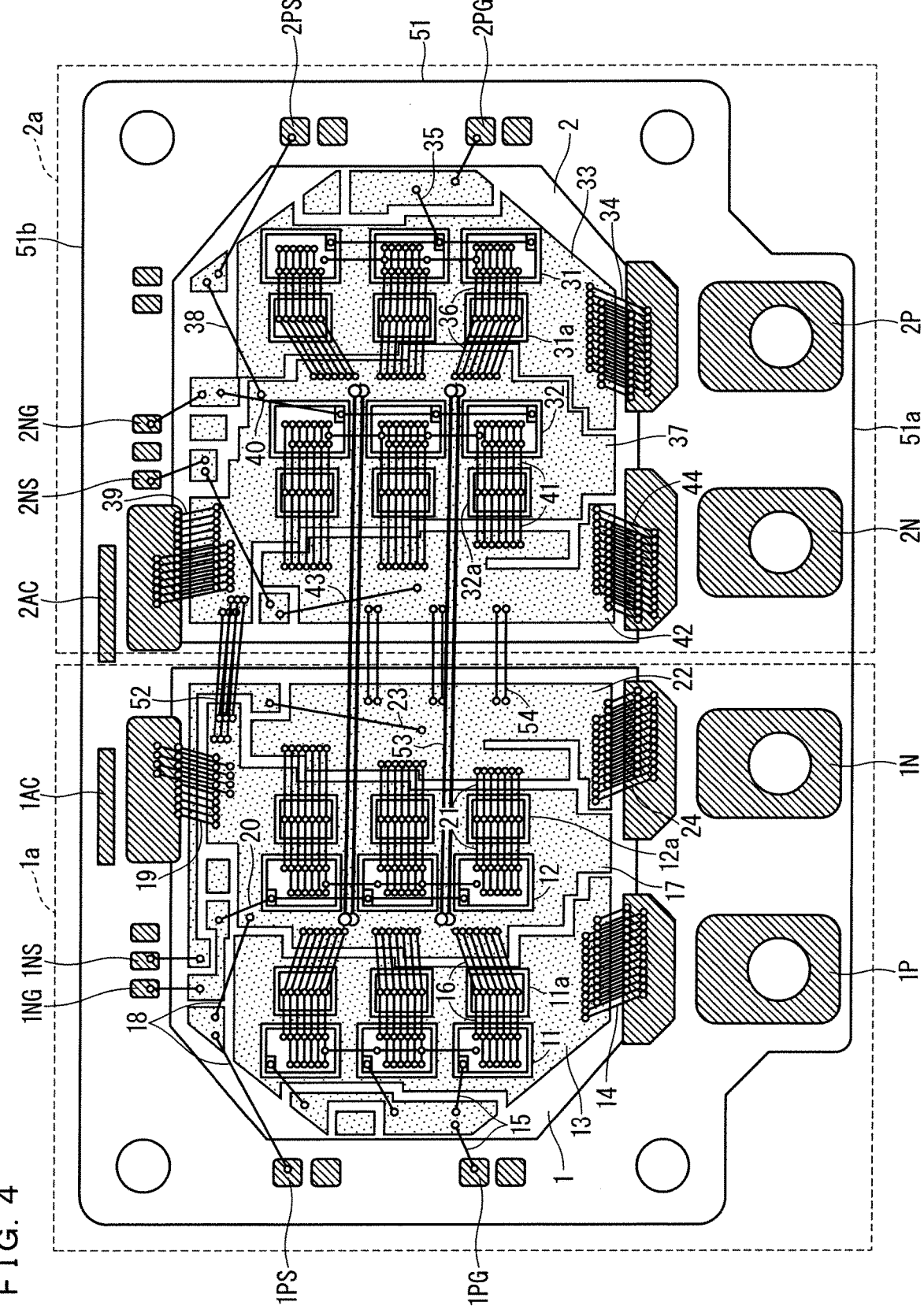

F I G. 5
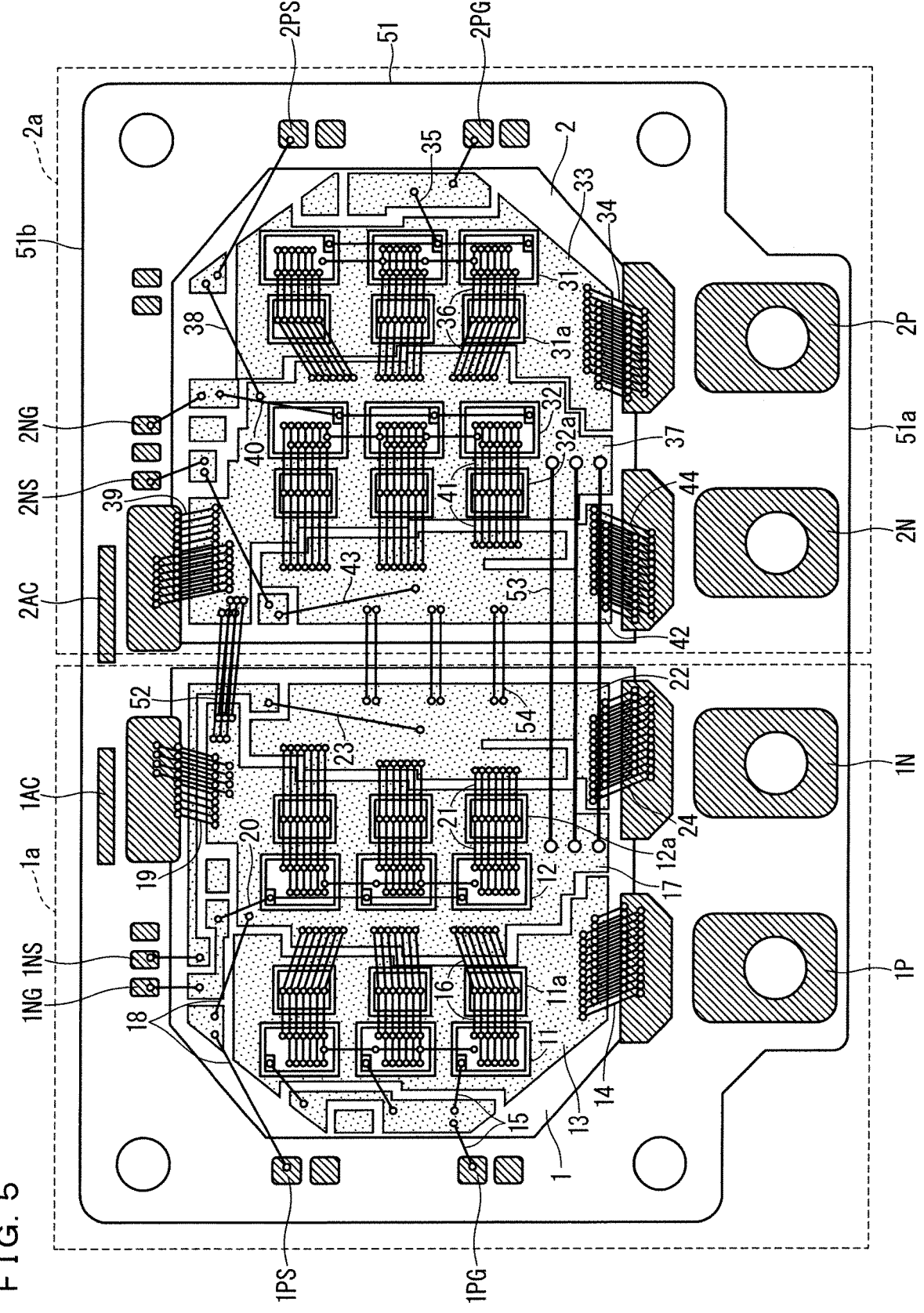

F I G. 6
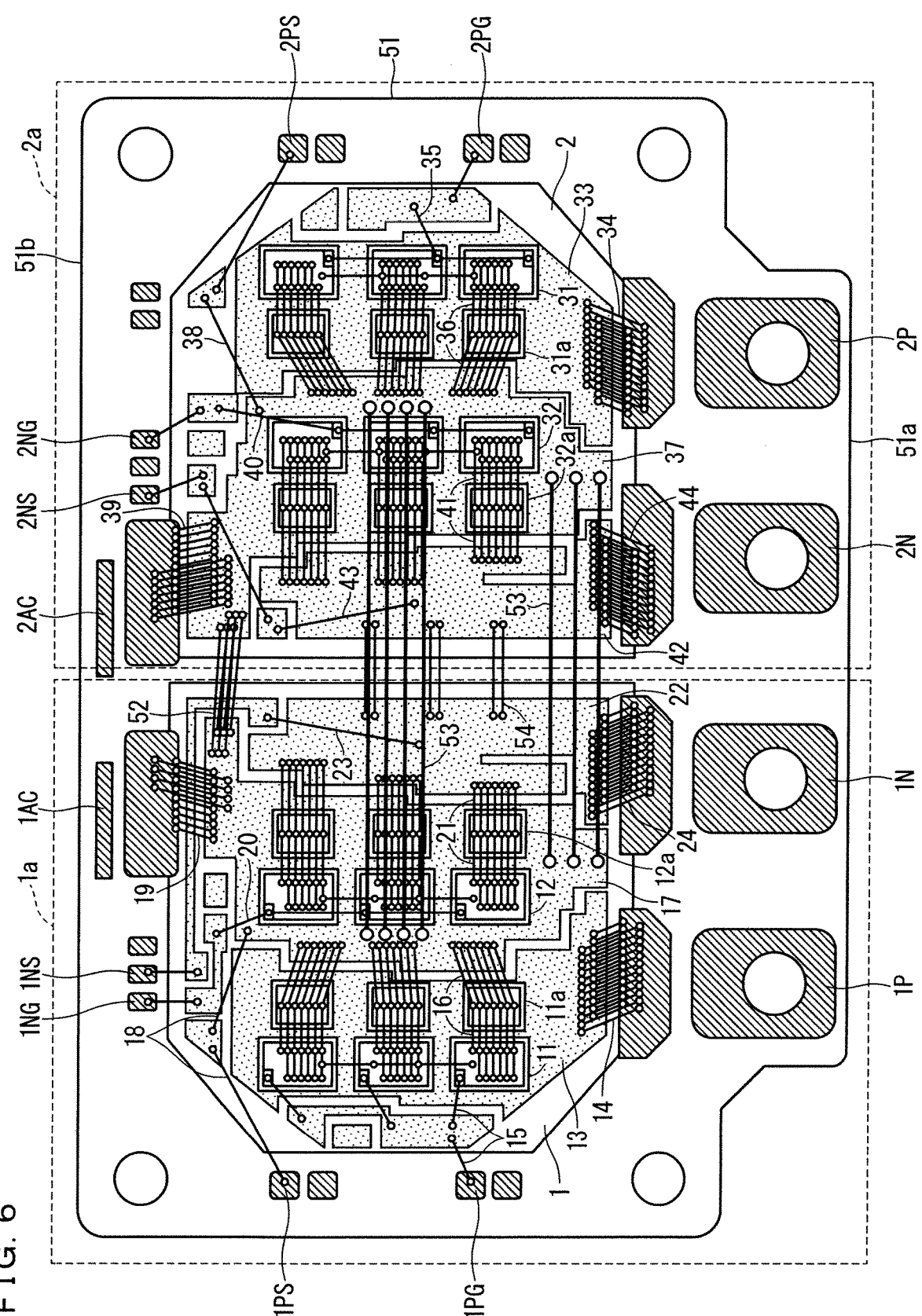

SEMICONDUCTOR DEVICE

BACKGROUND OF THE INVENTION

Field of the Invention

The present disclosure relates to a semiconductor device.

Description of the Background Art

In a semiconductor device such as a power module in which a plurality of semiconductor elements are connected by wires, when the number of semiconductor elements increases, there is a problem that the influence of the internal inductance increases and the oscillation of the main current and the gate voltage at the time of short circuit increases. Therefore, a technique for reducing the internal inductance has been proposed. For example, Japanese Patent Application Laid-Open No. 2014-225706 proposes a technique for reducing the inductance of the upper and lower arms by arranging a plurality of semiconductor elements mirror-symmetrically.

In a technique of Japanese Patent Application Laid-Open No. 2014-225706, since an inductance between the upper and lower arms, that is, semiconductor elements connected in series to each other can be reduced, oscillation can be reduced. However, in the technique of Japanese Patent Application Laid-Open No. 2014-225706, since an inductance between blocks cannot be reduced, there is a problem that oscillation between the blocks cannot be sufficiently reduced.

SUMMARY

The present disclosure has been made in view of the above problems, and an object of the present disclosure is to provide a technique capable of reducing oscillation between blocks at the time of short circuit.

A semiconductor device according to the present disclosure includes: a first insulating substrate and a second insulating substrate; a first semiconductor element and a second semiconductor element provided on a side of the first insulating substrate and connected in series with each other; a first metal pattern electrically connected with the first semiconductor element without being electrically connected with the second semiconductor element, a second metal pattern electrically connected with the first semiconductor element and the second semiconductor element, and a third metal pattern electrically connected with the second semiconductor element without being electrically connected with the first semiconductor element; a third semiconductor element and a fourth semiconductor element provided on a side of the second insulating substrate and connected in series with each other; a fourth metal pattern electrically connected with the third semiconductor element without being electrically connected with the fourth semiconductor element, a fifth metal pattern electrically connected to the third semiconductor element and the fourth semiconductor element, and a sixth metal pattern electrically connected to the fourth semiconductor element without being electrically connected to the third semiconductor element; a first P terminal, a first AC terminal, a first N terminal, a second P terminal, a second AC terminal and a second N terminal electrically connected to the first metal pattern, the second metal pattern, the third metal pattern, the fourth metal pattern, the fifth metal pattern, and the sixth metal pattern, respectively; a case in which a first P terminal, a first N terminal, a second N terminal, and a second P terminal are provided along a first end portion in this order, and the first AC terminal and the second AC terminal are provided along a second end portion opposite to the first end portion; and a first conductive portion straddling the third metal pattern and the sixth metal pattern in plan view and electrically connecting the second metal pattern and the fifth metal pattern.

Oscillation between blocks at the time of short circuit can be reduced.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 1 is a plan view illustrating a configuration of a semiconductor device according to a first preferred embodiment;

FIG. 2 is a circuit diagram illustrating the configuration of the semiconductor device according to the first preferred embodiment;

FIG. 3 is a plan view illustrating a configuration of a semiconductor device according to a second preferred embodiment;

FIG. 4 is a plan view illustrating a configuration of a semiconductor device according to a third preferred embodiment;

FIG. 5 is a plan view illustrating a configuration of a semiconductor device according to a fourth preferred embodiment; and FIG. 6 is a plan view illustrating a configuration of a semiconductor device according to a modification.

DESCRIPTION OF THE PREFERRED EMBODIMENTS

Hereinafter, preferred embodiments will be described with reference to the accompanying drawings. Features described in the following preferred embodiments are examples, and all features are not necessarily essential. In the following description, similar components in a plurality of preferred embodiments are denoted by the same or similar reference numerals, and different components will be mainly described. Furthermore, in the following description, specific positions and directions such as "upper", "lower", "left", "right", "front", or "back" may not necessarily coincide with actual positions and directions in practice.

First Preferred Embodiment

FIG. 1 is a plan view illustrating a configuration of a semiconductor device according to a first preferred embodiment, and FIG. 2 is a circuit diagram illustrating the configuration of the semiconductor device.

The semiconductor device of FIG. 1 includes a first insulating substrate 1 and a second insulating substrate 2, a first block circuit 1*a* and a second block circuit 2*a*, a case 51 having a substantially rectangular shape, and wires 52, 53, and 54. The first block circuit 1*a* and the second block circuit 2*a* are provided on the first insulating substrate 1 and the second insulating substrate 2 separated from each other, respectively. Hereinafter, the first block circuit 1*a* will be described first, and then the second block circuit 2*a* will be described.

<First Block Circuit 1a>

The first block circuit 1a includes a P-side semiconductor element 11, a P-side diode 11a, an N-side semiconductor element 12, an N-side diode 12a, a P-side metal pattern 13, a first P terminal 1P, a first P-side gate terminal 1PG, an AC-side metal pattern 17, a first P-side source terminal 1PS, a first AC terminal 1AC, a first N-side gate terminal 1NG, an N-side metal pattern 22, a first N-side source terminal 1NS, and a first N terminal 1N.

The P-side semiconductor element 11 as a first semiconductor element and the N-side semiconductor element 12 as a second semiconductor element are provided on the first insulating substrate 1 side. As illustrated in FIG. 2, a source electrode of the P-side semiconductor element 11 and a drain electrode of the N-side semiconductor element 12 are electrically connected to each other, so that the P-side semiconductor element 11 and the N-side semiconductor element 12 are connected in series to form upper and lower arms.

In the first preferred embodiment, each of the P-side semiconductor element 11 and the N-side semiconductor element 12 is a metal oxide semiconductor field effect transistor (MOSFET). However, each of the P-side semiconductor element 11 and the N-side semiconductor element 12 is not limited to this, and may be, for example, an insulated gate bipolar transistor (IGBT), a reverse conducting-IGBT (RC-IGBT), or the like.

Furthermore, in plan view of FIG. 1, each of the P-side semiconductor element 11 and the N-side semiconductor element 12 has a gate electrode and a source electrode on the front side of the P-side semiconductor element 11 and the N-side semiconductor element 12, and has a drain electrode on the back side of the P-side semiconductor element 11 and the N-side semiconductor element 12. However, the gate electrode, the source electrode, and the drain electrode of each of the P-side semiconductor element 11 and the N-side semiconductor element 12 are not limited to the arrangement of FIG. 1.

A material of each of the P-side semiconductor element 11 and the N-side semiconductor element 12 may be normal silicon (Si), or may be a wide band gap semiconductor such as silicon carbide (SiC), gallium nitride (GaN), or diamond. When the material of each of the P-side semiconductor element 11 and the N-side semiconductor element 12 is a wide band gap semiconductor, stable operation under high temperature and high voltage, and high switching speed can be achieved.

The P-side diode 11a and the N-side diode 12a are provided on the first insulating substrate 1 side, and are connected in parallel to the P-side semiconductor element 11 and the N-side semiconductor element 12, respectively, as illustrated in FIG. 2. Each of the P-side diode 11a and the N-side diode 12a may be a schottky barrier diode (SBD) or a PN junction diode (PND).

Note that in the examples of FIGS. 1 and 2, the number of each of the P-side semiconductor element 11, the P-side diode 11a, the N-side semiconductor element 12, and the N-side diode 12a is three, but the number is not limited thereto.

The P-side metal pattern 13, which is a first metal pattern, is provided on the first insulating substrate 1. The P-side metal pattern 13 is not electrically connected to the N-side semiconductor element 12, but is electrically connected to a drain electrode of the P-side semiconductor element 11. The first P terminal 1P is electrically connected to the P-side metal pattern 13 by a wire 14.

The first P-side gate terminal 1PG is electrically connected to the gate electrode of the P-side semiconductor element 11 by a wire 15 or the like.

The AC-side metal pattern 17, which is a second metal pattern, is provided on the first insulating substrate 1. The AC-side metal pattern 17 is electrically connected to a source electrode of the P-side semiconductor element 11 by a wire 16. Furthermore, the AC-side metal pattern 17 is electrically connected to a drain electrode of the N-side semiconductor element 12. As a result, as described above, the P-side semiconductor element 11 and the N-side semiconductor element 12 are connected in series with each other.

The first P-side source terminal 1PS is electrically connected to the AC-side metal pattern 17 by a wire 18 or the like, and the first AC terminal 1AC is electrically connected to the AC-side metal pattern 17 by a wire 19.

With the above configuration, the P-side semiconductor element 11 controls a current flowing between the first P terminal 1P, the first P-side source terminal 1PS, and the first AC terminal 1AC based on a gate voltage applied to the first P-side gate terminal 1PG. Since the current flowing between the first P terminal 1P and the first AC terminal 1AC flows substantially in a lateral direction of the case 51, a path of the current can be made relatively short, and an inductance related to the current can be reduced. In addition, since the current flowing between the first P terminal 1P and the first AC terminal 1AC flows in portions close to each of the P-side metal pattern 13 and the AC-side metal pattern 17, an inductance related to the current can be reduced.

The first N-side gate terminal 1NG is electrically connected to a gate electrode of the N-side semiconductor element 12 by a wire 20 or the like.

The N-side metal pattern 22, which is a third metal pattern, is provided on the first insulating substrate 1. The N-side metal pattern 22 is not electrically connected to the P-side semiconductor element 11, but is electrically connected to a source electrode of the N-side semiconductor element 12 by a wire 21.

The first N-side source terminal 1NS is electrically connected to the N-side metal pattern 22 by a wire 23 or the like, and the first N terminal 1N is electrically connected to the N-side metal pattern 22 by a wire 24.

With the above configuration, the N-side semiconductor element 12 controls a current flowing between the first AC terminal 1AC, the first N-side source terminal 1NS, and the first N terminal 1N based on a gate voltage applied to the first N-side gate terminal 1NG. Since the current flowing between the first AC terminal 1AC and the first N terminal 1N flows substantially in a lateral direction of the case 51, a path of the current can be made relatively short, and an inductance related to the current can be reduced. In addition, since the current flowing between the first AC terminal 1AC and the first N terminal 1N flows in portions close to each of the AC-side metal pattern 17 and the N-side metal pattern 22, an inductance related to the current can be reduced.

<Second Block Circuit 2a>

Since the second block circuit 2a is substantially mirror symmetrically with the first block circuit 1a, the configuration of the second block circuit 2a described below is substantially the same as the configuration of the first block circuit 1a.

The second block circuit 2a includes a P-side semiconductor element 31, a P-side diode 31a, an N-side semiconductor element 32, an N-side diode 32a, a P-side metal pattern 33, a second P terminal 2P, a second P-side gate terminal 2PG, an AC-side metal pattern 37, a second P-side source terminal 2PS, a second AC terminal 2AC, a second N-side gate terminal 2NG, an N-side metal pattern 42, a second N-side source terminal 2NS, and a second N terminal 2N.

The P-side semiconductor element 31 as a third semiconductor element and the N-side semiconductor element 32 as a fourth semiconductor element are provided on the second insulating substrate 2 side. As illustrated in FIG. 2, a source electrode of the P-side semiconductor element 31 and a drain electrode of the N-side semiconductor element 32 are electrically connected to each other, so that the P-side semiconductor element 31 and the N-side semiconductor element 32 are connected in series to form upper and lower arms. The P-side semiconductor element 31 and the N-side semiconductor element 32 are similar to the P-side semiconductor element 11 and the N-side semiconductor element 12.

The P-side diode 31a and the N-side diode 32a are provided on the second insulating substrate 2 side, and are connected in parallel to the P-side semiconductor element 31 and the N-side semiconductor element 32, respectively, as illustrated in FIG. 2. The P-side diode 31a and the N-side diode 32a are similar to the P-side diode 11a and the N-side diode 12a.

The P-side metal pattern 33, which is a fourth metal pattern, is provided on the second insulating substrate 2. The P-side metal pattern 33 is not electrically connected to the N-side semiconductor element 32, but is electrically connected to a drain electrode of the P-side semiconductor element 31. The second P terminal 2P is electrically connected to the P-side metal pattern 33 by a wire 34.

The second P-side gate terminal 2PG is electrically connected to a gate electrode of the P-side semiconductor element 31 by a wire 35 or the like.

The AC-side metal pattern 37, which is a fifth metal pattern, is provided on the second insulating substrate 2. The AC-side metal pattern 37 is electrically connected to a source electrode of the P-side semiconductor element 31 by a wire 36. Furthermore, the AC-side metal pattern 37 is electrically connected to the drain electrode of the N-side semiconductor element 32. As a result, as described above, the P-side semiconductor element 31 and the N-side semiconductor element 32 are connected in series with each other.

The second P-side source terminal 2PS is electrically connected to the AC-side metal pattern 37 by a wire 38 or the like, and the second AC terminal 2AC is electrically connected to the AC-side metal pattern 37 by a wire 39.

With the above configuration, the P-side semiconductor element 31 controls a current flowing between the second P terminal 2P, the second P-side source terminal 2PS, and the second AC terminal 2AC based on a gate voltage applied to the second P-side gate terminal 2PG. Note that since the second block circuit 2a is substantially mirror symmetrically with the first block circuit 1a, an inductance related to a current flowing between the second P terminal 2P and the second AC terminal 2AC can be reduced similarly to the current flowing between the first P terminal 1P and the first AC terminal 1AC.

The second N-side gate terminal 2NG is electrically connected to a gate electrode of the N-side semiconductor element 32 by a wire 40 or the like.

The N-side metal pattern 42, which is a sixth metal pattern, is provided on the second insulating substrate 2. The N-side metal pattern 42 is not electrically connected to the P-side semiconductor element 31, but is electrically connected to a source electrode of the N-side semiconductor element 32 by a wire 41.

The second N-side source terminal 2NS is electrically connected to the N-side metal pattern 42 by a wire 43 or the like, and the second N terminal 2N is electrically connected to the N-side metal pattern 42 by a wire 44.

With the above configuration, the N-side semiconductor element 32 controls a current flowing between the second AC terminal 2AC, the second N-side source terminal 2NS, and the second N terminal 2N based on a voltage applied to the second N-side gate terminal 2NG. Note that since the second block circuit 2a is substantially mirror symmetrically with the first block circuit 1a, an inductance related to a current flowing between the second AC terminal 2AC and the second N terminal 2N can be reduced similarly to the current flowing between the first AC terminal 1AC and the first N terminal 1N.

<Configuration Other than Those of First Block Circuit 1a and Second Block Circuit 2a>

The case 51 has a first end portion 51a and a second end portion 51b on opposite side of the first end portion 51a. The first P terminal 1P, the first N terminal 1N, the second N terminal 2N, and the second P terminal 2P are provided along the first end portion 51a in this order, and the first AC terminal 1AC and the second AC terminal 2AC are provided along the second end portion 51b.

The wire 52 electrically connects a portion of the AC-side metal pattern 17 on the first AC terminal 1AC side and a portion of the AC-side metal pattern 37 on the second AC terminal 2AC side. Therefore, since the source electrode of the P-side semiconductor element 11 and the source electrode of the P-side semiconductor element 31 are electrically connected, an inductance on the source electrode side can be reduced. As a result, oscillation of the main current and the gate voltage amplified by the inductance on the source electrode side at the time of short circuit can be reduced.

However, the wire 52 is connected to a portion of the AC-side metal patterns 17 and 37 that does not sandwich the N-side metal patterns 22 and 42. For this reason, when the number of wires 52 is to be increased, it is necessary to increase the area of a portion of the AC-side metal patterns 17 and 37 that does not sandwich the N-side metal patterns 22 and 42, and as a result, there arises a problem that the size of the semiconductor device in the vertical direction in FIG. 1 increases.

On the other hand, in the first preferred embodiment, a wire 53, which is a first conductive portion, straddles the N-side metal pattern 22 and the N-side metal pattern 42 in plan view and electrically connects the AC-side metal pattern 17 and the AC-side metal pattern 37. According to such a configuration, the number of wires 53 can be increased without increasing the area of the portion of the AC-side metal patterns 17 and 37 that does not sandwich the N-side metal patterns 22 and 42. Therefore, an inductance between the source electrode of the P-side semiconductor element 11 and the source electrode of the P-side semiconductor element 31 can be reduced while maintaining the size of the semiconductor device, and the oscillation between the first block circuit 1a and the second block circuit 2a at the time of short circuit can be reduced.

In addition, there are variations in distances between the source electrodes of the plurality of P-side semiconductor elements 11 and the connection points of the wires 52, and similarly, there are variations in distances between the source electrodes of the plurality of P-side semiconductor elements 31 and the connection points of the wires 52. For this reason, the inductance balance between the source electrodes of the plurality of P-side semiconductor elements 11 and the source electrodes of the plurality of P-side semiconductor elements 31 is deteriorated. On the other hand, in the present first preferred embodiment, the inductance balance between the source electrodes of the plurality of P-side semiconductor elements 11 and the source electrodes of the plurality of P-side semiconductor elements 31 can be improved by the wire 53.

A wire 54 electrically connects the N-side metal pattern 22 and the N-side metal pattern 42.

Summary of First Preferred Embodiment

In the semiconductor device according to the present first preferred embodiment as described above, the wire 53, which is the first conductive portion, straddles the N-side metal pattern 22 and the N-side metal pattern 42 in plan view and electrically connects the AC-side metal pattern 17 and the AC-side metal pattern 37. According to such a configuration, oscillation of the main current and the gate voltage between the first block circuit 1a and the second block circuit 2a at the time of short circuit can be reduced while maintaining the size of the semiconductor device.

Furthermore, in the present first preferred embodiment, the first P terminal 1P, the first N terminal 1N, the second N terminal 2N, and the second P terminal 2P are provided along the first end portion 51a portion in this order. According to such a configuration, the AC-side metal patterns 17 and 37 and the N-side metal patterns 22 and 42 can be provided so that the AC-side metal patterns 17 and 37 sandwich the N-side metal patterns 22 and 42. Therefore, the wire 54 electrically connecting the N-side metal pattern 22 and the N-side metal pattern 42 can be shortened, and the inductance between the source electrode of the N-side semiconductor element 12 and the source electrode of the N-side semiconductor element 32 can be reduced. As a result, oscillation between the first block circuit 1a and the second block circuit 2a at the time of short circuit can be reduced.

Note that in the above description, the first conductive portion is the wire 53 but is not limited thereto, and for example, the first conductive portion may be a metal plate.

Second Preferred Embodiment

FIG. 3 is a plan view illustrating a configuration of a semiconductor device according to the present second preferred embodiment.

In the present second preferred embodiment, the AC-side metal patterns 17 and 37 have a first concave portion and a second concave portion that open to the first end portion 51a side in plan view, respectively. Then, the side portions of the first concave portion and the second concave portion electrically connected to the P-side semiconductor element 11 and the P-side semiconductor element 31 include a first convex portion 17a and a second convex portion 37a each having a width increasing from the first end portion 51a toward the second end portion 51b, respectively.

According to such a configuration, widths of the first convex portion 17a and the second convex portion 37a increase toward the first AC terminal 1AC and the second AC terminal 2AC, and impedances of the AC-side metal patterns 17 and 37 decrease. Therefore, it is possible to suppress an influence caused by increasing a current flowing through a portion close to the first AC terminal 1AC and the second AC terminal 2AC in the AC-side metal patterns 17 and 37, which makes it possible to increase the main current of the P-side semiconductor elements 11 and 31.

Furthermore, in the present second preferred embodiment, the N-side metal patterns 22 and 42 have a width that increases from the second end portion 51b toward the first end portion 51a in plan view, and have a third convex portion 22a and a fourth convex portion 42a provided in the first concave portion and the second concave portion, respectively.

According to such a configuration, widths of the third convex portion 22a and the fourth convex portion 42a increase toward the first N terminal 1N and the second N terminal 2N, and impedances of the N-side metal patterns 22 and 42 decrease. Therefore, it is possible to suppress an influence caused by increasing a current flowing through a portion close to the first N terminal 1N and the second N terminal 2N in the N-side metal patterns 22 and 42, which makes it possible to increase the main current of the N-side semiconductor elements 12 and 32.

In addition, the semiconductor device according to the present second preferred embodiment includes a plurality of wires 25 that is a plurality of first conductive members included in a second conductive portion, and a plurality of wires 45 that is a plurality of second conductive members included in a third conductive portion. Since the plurality of wires 25 straddles the third convex portion 22a in plan view and electrically connect the portions of the AC-side metal pattern 17 sandwiching the third convex portion 22a, the balance of inductance between the P-side semiconductor element 11 and the N-side semiconductor element 12 can be improved. Since the plurality of wires 45 straddles the fourth convex portion 42a in plan view and electrically connect the portions of the AC-side metal pattern 37 sandwiching the fourth convex portion 42a, the balance of inductance between the P-side semiconductor element 31 and the N-side semiconductor element 32 can be improved.

Furthermore, in the present second preferred embodiment, the plurality of wires 25 is arranged from the first end portion 51a toward the second end portion 51b, and the length of wires 25 decreases from the first end portion 51a toward the second end portion 51b to reduce the inductance. According to such a configuration, a balance of inductances between the plurality of P-side semiconductor elements 11 and the plurality of N-side semiconductor elements 12 can be improved. Furthermore, the plurality of wires 45 is arranged from the first end portion 51a toward the second end portion 51b, and the length of wires 45 decreases from the first end portion 51a toward the second end portion 51b to reduce the inductance. According to such a configuration, a balance of inductances between the plurality of P-side semiconductor elements 31 and the plurality of N-side semiconductor elements 32 can be improved.

In addition, in the present second preferred embodiment, a plurality of wires 16, which is a plurality of third conductive members, is arranged from the first end portion 51a toward the second end portion 51b, and the length of wires 16 increases from the first end portion 51a toward the second end portion 51b. According to such a configuration, a balance of inductances between the plurality of P-side semiconductor elements 11 and the plurality of N-side semiconductor elements 12 can be improved. In addition, a plurality of wires 36, which is a plurality of fourth conductive members, is arranged from the first end portion 51a toward the second end portion 51b, and the length of wires 36 increases from the first end portion 51a toward the second end portion 51b. According to such a configuration, a balance of inductances between the plurality of P-side semiconductor elements 31 and the plurality of N-side semiconductor elements 32 can be improved.

Note that in the above description, the second conductive portion and the third conductive portion are the wires 25 and 45, but is not limited thereto, and for example, each of the second conductive portion and the third conductive portion may be a metal plate. Note that in the present second preferred embodiment, the configuration including the wire 53 as the first conductive portion has been described, but the wire 53 is not essential. In the present second preferred embodiment, even if the wire 53 is not provided, the oscillation at the time of short circuit in the first block circuit 1*a* can be reduced by the wire 25, and the oscillation at the time of short circuit in the second block circuit 2*a* can be reduced by the wire 45. Therefore, the oscillation in each block at the time of short circuit can be reduced. In addition, a portion of the AC-side metal pattern 17 on the first end portion 51*a* side and a portion of the AC-side metal pattern 37 on the first end portion 51*a* side may be electrically connected by a wire 46. Since this connection can reduce an inductance between the source electrode of the P-side semiconductor element 11 and the source electrode of the P-side semiconductor element 31, the oscillation between the first block circuit 1*a* and the second block circuit 2*a* at the time of short circuit can be reduced.

Third Preferred Embodiment

FIG. 4 is a plan view illustrating a configuration of a semiconductor device according to the present third preferred embodiment.

In general, when a wire is provided above a semiconductor element for circuit connection, air bubbles may remain in a sealant between the wires or between the semiconductor element and the wire when the sealant is injected into a case 51. Therefore, in the present preferred embodiment 3, a wire 53 is provided to avoid an N-side semiconductor element 12 and an N-side semiconductor element 32 in plan view. According to such a configuration, remaining of air bubbles in the sealant can be suppressed.

Fourth Preferred Embodiment

FIG. 5 is a plan view illustrating a configuration of a semiconductor device according to the present fourth preferred embodiment.

In the present fourth preferred embodiment, a wire 53 electrically connects a portion of an AC-side metal pattern 17 on a first end portion 51*a* side and a portion of an AC-side metal pattern 37 on a first end portion 51*a* side. According to such a configuration, as in the first preferred embodiment, an inductance between a source electrode of a P-side semiconductor element 11 and a source electrode of a P-side semiconductor element 31 can be reduced while maintaining the size of the semiconductor device, so that oscillation between blocks at the time of short circuit can be reduced. In addition, an inductance balance between the source electrodes of a plurality of P-side semiconductor elements 11 and the source electrodes of a plurality of P-side semiconductor elements 31 can be improved.

<Modification>

As illustrated in FIG. 6, the wire 53 according to the first preferred embodiment and the wire 53 according to the fourth preferred embodiment may be combined. Furthermore, the combination is not limited to this, and for example, the wire 53 according to the second and third preferred embodiments and the wire 53 according to the fourth preferred embodiment may be combined.

Note that each preferred embodiment and each modification can be freely combined, and each preferred embodiment and each modification can be appropriately modified or omitted.

Hereinafter, various aspects of the present disclosure will be collectively described as appendices.

Appendix 1

A semiconductor device comprising: a first insulating substrate and a second insulating substrate;

a first semiconductor element and a second semiconductor element provided on a side of the first insulating substrate and connected in series with each other;

a first metal pattern electrically connected with the first semiconductor element without being electrically connected with the second semiconductor element, a second metal pattern electrically connected with the first semiconductor element and the second semiconductor element, and a third metal pattern electrically connected with the second semiconductor element without being electrically connected with the first semiconductor element;

a third semiconductor element and a fourth semiconductor element provided on a side of the second insulating substrate and connected in series with each other;

a fourth metal pattern electrically connected with the third semiconductor element without being electrically connected with the fourth semiconductor element, a fifth metal pattern electrically connected to the third semiconductor element and the fourth semiconductor element, and a sixth metal pattern electrically connected to the fourth semiconductor element without being electrically connected to the third semiconductor element;

a first P terminal, a first AC terminal, a first N terminal, a second P terminal, a second AC terminal and a second N terminal electrically connected to the first metal pattern, the second metal pattern, the third metal pattern, the fourth metal pattern, the fifth metal pattern, and the sixth metal pattern, respectively;

a case in which a first P terminal, a first N terminal, a second N terminal, and a second P terminal are provided along a first end portion in this order, and the first AC terminal and the second AC terminal are provided along a second end portion opposite to the first end portion; and a first conductive portion straddling the third metal pattern and the sixth metal pattern in plan view and electrically connecting the second metal pattern and the fifth metal pattern.

Appendix 2

A semiconductor device comprising:

a first insulating substrate and a second insulating substrate;

a first semiconductor element and a second semiconductor element provided on a side of the first insulating substrate and connected in series with each other;

a first metal pattern electrically connected with the first semiconductor element without being electrically connected with the second semiconductor element, a second metal pattern electrically connected with the first semiconductor element and the second semiconductor element, and a third metal pattern electrically connected with the second semiconductor element without being electrically connected with the first semiconductor element;

a third semiconductor element and a fourth semiconductor element provided on a side of the second insulating substrate and connected in series with each other;

a fourth metal pattern electrically connected with the third semiconductor element without being electrically connected with the fourth semiconductor element, a fifth metal pattern electrically connected to the third semiconductor element and the fourth semiconductor element, and a sixth metal pattern electrically connected to the fourth semiconductor element without being electrically connected to the third semiconductor element;

a first P terminal, a first AC terminal, a first N terminal, a second P terminal, a second AC terminal and a second N terminal electrically connected to the first metal pattern, the second metal pattern, the third metal pattern, the fourth metal pattern, the fifth metal pattern, and the sixth metal pattern, respectively; and a case in which a first P terminal, a first N terminal, a second N terminal, and a second P terminal are provided along a first end portion in this order, and the first AC terminal and the second AC terminal are provided along a second end portion opposite to the first end portion, wherein the second metal pattern and the fifth metal pattern include a first concave portion and a second concave portion opened to the first end portion side in a plan view, respectively, side portions of the first concave portion and the second concave portion electrically connected to the first semiconductor element and the third semiconductor element, include a first convex portion and a second convex portion each having a width increasing from the first end portion toward the second end portion, respectively, and the third metal pattern and the sixth metal pattern include a third convex portion and a fourth convex portion each having a width increasing from the second end portion toward the first end portion in plan view and provided in the first concave portion and the second concave portion, respectively.

Appendix 3

The semiconductor device according to Appendix 2, further comprising:

a second conductive portion straddling the third convex portion in plan view and electrically connecting portions of the second metal pattern sandwiching the third convex portion to each other; and a third conductive portion straddling the fourth convex portion in plan view and electrically connecting portions of the fifth metal pattern sandwiching the fourth convex portion to each other.

Appendix 4

The semiconductor device according to Appendix 3, wherein the second conductive portion includes a plurality of first conductive members arranged from the first end portion toward the second end portion and having a length decreasing from the first end portion toward the second end portion, and the third conductive portion includes a plurality of second conductive members arranged from the first end portion toward the second end portion and having a length decreasing from the first end portion toward the second end portion.

Appendix 5

The semiconductor device according to any one of Appendices 2 to 4, wherein a plurality of third conductive members electrically connecting the first semiconductor element and the second metal pattern are arranged from the first end portion toward the second end portion, and have a length increasing from the first end portion toward the second end portion, and a plurality of fourth conductive members electrically connecting the second semiconductor element and the fifth metal pattern are arranged from the first end portion toward the second end portion, and have a length increasing from the first end portion toward the second end portion.

Appendix 6

The semiconductor device according to Appendix 1, wherein the first conductive portion is provided to avoid the second semiconductor element and the fourth semiconductor element in plan view.

Appendix 7

The semiconductor device according to Appendix 1, wherein the first conductive portion electrically connects a portion of the second metal pattern on the first end portion side and a portion of the fifth metal pattern on the first end portion side.

While the disclosure has been shown and described in detail, the foregoing description is in all aspects illustrative and not restrictive. It is therefore understood that numerous modifications and variations can be devised.

What is claimed is:

1. A semiconductor device comprising:

a first insulating substrate and a second insulating substrate;

a first semiconductor element and a second semiconductor element provided on a side of the first insulating substrate and connected in series with each other;

a first metal pattern electrically connected with the first semiconductor element without being electrically connected with the second semiconductor element, a second metal pattern electrically connected with the first semiconductor element and the second semiconductor element, and a third metal pattern electrically connected with the second semiconductor element without being electrically connected with the first semiconductor element;

a third semiconductor element and a fourth semiconductor element provided on a side of the second insulating substrate and connected in series with each other;

a fourth metal pattern electrically connected with the third semiconductor element without being electrically connected with the fourth semiconductor element, a fifth metal pattern electrically connected to the third semiconductor element and the fourth semiconductor element and a sixth metal pattern electrically connected to the fourth semiconductor element without being electrically connected to the third semiconductor element;

a first P terminal, a first AC terminal, a first N terminal, a second P terminal, a second AC terminal and a second N terminal electrically connected to the first metal pattern, the second metal pattern, the third metal pattern, the fourth metal pattern, the fifth metal pattern, and the sixth metal pattern, respectively;

a case in which a first P terminal, a first N terminal, a second N terminal, and a second P terminal are provided along a first end portion in this order, and the first AC terminal and the second AC terminal are provided along a second end portion opposite to the first end portion; and a first conductive portion straddling the third metal pattern and the sixth metal pattern in plan view and electrically connecting the second metal pattern and the fifth metal pattern.

2. The semiconductor device according to claim 1, wherein the first conductive portion is provided to avoid the second semiconductor element and the fourth semiconductor element in plan view.

3. The semiconductor device according to claim 1, wherein the first conductive portion electrically connects a portion of the second metal pattern on the first end portion side and a portion of the fifth metal pattern on the first end portion side.

4. A semiconductor device comprising:

a first insulating substrate and a second insulating substrate;

a first semiconductor element and a second semiconductor element provided on a side of the first insulating substrate and connected in series with each other;

a first metal pattern electrically connected with the first semiconductor element without being electrically connected with the second semiconductor element, a second metal pattern electrically connected with the first semiconductor element and the second semiconductor element, and a third metal pattern electrically connected with the second semiconductor element without being electrically connected with the first semiconductor element;

a third semiconductor element and a fourth semiconductor element provided on a side of the second insulating substrate and connected in series with each other;

a fourth metal pattern electrically connected with the third semiconductor element without being electrically connected with the fourth semiconductor element, a fifth metal pattern electrically connected to the third semiconductor element and the fourth semiconductor element, and a sixth metal pattern electrically connected to the fourth semiconductor element without being electrically connected to the third semiconductor element;

a first P terminal, a first AC terminal, a first N terminal, a second P terminal, a second AC terminal, and a second N terminal electrically connected to the first metal pattern, the second metal pattern, the third metal pattern, the fourth metal pattern, the fifth metal pattern, and the sixth metal pattern, respectively; and a case in which a first P terminal, a first N terminal, a second N terminal, and a second P terminal are provided along a first end portion in this order, and the first AC terminal and the second AC terminal are provided along a second end portion opposite to the first end portion, wherein the second metal pattern and the fifth metal pattern include a first concave portion and a second concave portion opened to the first end portion side in a plan view, respectively, side portions of the first concave portion and the second concave portion electrically connected to the first semiconductor element and the third semiconductor element, include a first convex portion and a second convex portion each having a width increasing from the first end portion toward the second end portion, respectively, and the third metal pattern and the sixth metal pattern include a third convex portion and a fourth convex portion each having a width increasing from the second end portion toward the first end portion in plan view and provided in the first concave portion and the second concave portion, respectively.

5. The semiconductor device according to claim 4, further comprising:

a second conductive portion straddling the third convex portion in plan view and electrically connecting portions of the second metal pattern sandwiching the third convex portion to each other; and a third conductive portion straddling the fourth convex portion in plan view and electrically connecting portions of the fifth metal pattern sandwiching the fourth convex portion to each other.

6. The semiconductor device according to claim 5, wherein the second conductive portion includes a plurality of first conductive members arranged from the first end portion toward the second end portion and having a length decreasing from the first end portion toward the second end portion, and the third conductive portion includes a plurality of second conductive members arranged from the first end portion toward the second end portion and having a length decreasing from the first end portion toward the second end portion.

7. The semiconductor device according to claim 6, wherein a plurality of third conductive members electrically connecting the first semiconductor element and the second metal pattern are arranged from the first end portion toward the second end portion, and have a length increasing from the first end portion toward the second end portion, and a plurality of fourth conductive members electrically connecting the second semiconductor element and the fifth metal pattern are arranged from the first end portion toward the second end portion, and have a length increasing from the first end portion toward the second end portion.

8. The semiconductor device according to claim 5, wherein a plurality of third conductive members electrically connecting the first semiconductor element and the second metal pattern are arranged from the first end portion toward the second end portion, and have a length increasing from the first end portion toward the second end portion, and a plurality of fourth conductive members electrically connecting the second semiconductor element and the fifth metal pattern are arranged from the first end portion toward the second end portion, and have a length increasing from the first end portion toward the second end portion.

9. The semiconductor device according to claim 4, wherein a plurality of third conductive members electrically connecting the first semiconductor element and the second metal pattern are arranged from the first end portion toward the second end portion, and have a length increasing from the first end portion toward the second end portion, and a plurality of fourth conductive members electrically connecting the second semiconductor element and the fifth metal pattern are arranged from the first end portion toward the second end portion, and have a length increasing from the first end portion toward the second end portion.

* * * * *